United States Patent [19]

Shimizu

[11] Patent Number: 5,070,390

[45] Date of Patent: Dec. 3, 1991

[54] SEMICONDUCTOR DEVICE USING A TAPE CARRIER

[75] Inventor: Mitsuharu Shimizu, Nagano, Japan

[73] Assignee: Shinko Electric Industries Co., Ltd., Nagano, Japan

[21] Appl. No.: 531,092

[22] Filed: May 31, 1990

[30] Foreign Application Priority Data

Jun. 6, 1989 [JP] Japan .................................. 1-143511

[51] Int. Cl.[5] .......................................... H01L 23/48
[52] U.S. Cl. ........................................ 357/70; 357/80; 357/74; 357/68
[58] Field of Search ........................ 357/70, 80, 74, 68

[56] References Cited

U.S. PATENT DOCUMENTS

| | | | |
|---|---|---|---|
| 3,364,440 | 1/1968 | Granberry | 357/80 |
| 3,777,221 | 12/1973 | Tausko et al. | 317/101 |
| 3,784,883 | 1/1974 | Duncan et al. | 357/80 |
| 4,812,421 | 3/1989 | Jung et al. | 357/70 |
| 4,916,519 | 4/1990 | Ward | 357/80 |
| 4,922,324 | 5/1990 | Sudo | 357/74 |

Primary Examiner—Andrew J. James
Assistant Examiner—T. Davenport
Attorney, Agent, or Firm—Staas & Halsey

[57] ABSTRACT

A semiconductor device comprising a chip having a plurality of electrodes, a lead frame including a plurality of leads, a tape carrier having an insulative base film and a plurality of conductive patterns formed on the base film, one of the conductive patterns being used as a ground line. The electrodes of the chip are electrically connected to the respective leads of the lead frame via the respective conductive patterns of the tape carrier, a molded resin is used for hermetically and integrally sealing at least the chip and the tape carrier, and a conductive pad is arranged in the vicinity of the conductive patterns of the tape carrier and is electrically connected to the ground line to constitute a microstrip circuit.

5 Claims, 4 Drawing Sheets

SEMICONDUCTOR DEVICE USING A TAPE CARRIER

BACKGROUND OF THE INVENTION

1. Field of the Invention

This invention relates to a semiconductor device, and more particularly, to a semiconductor device using a tape automated bonding tape carrier (hereinafter referred to simply as "TAB tape carrier") for connecting electrodes or pads of a semiconductor chip to respective leads of a lead frame.

2. Description of the Related Art

A TAB tape carrier is generally used, in place of a wire bonding, for connecting electrodes of various devices to electrical circuits of, for example, a lead frame, via conductive line patterns formed on an insulative base film of the TAB tape carrier, and a semiconductor device using a TAB tape carrier is generally made as follows: the inner leads of the TAB tape carrier are connected to the respective electrodes of the semiconductor chip, the outer leads of the TAB tape carrier are connected to the respective leads of the lead frame, and the semiconductor chip is then hermetically sealed or covered with a resin.

As conventionally known, a TAB tape carrier comprises an insulative base film made of, for example, a polyimide film strip having a number of longitudinal segments each provided with a plurality of conductive circuit patterns formed of, for example, copper foil, electroplated gold, or the like. Such a TAB tape carrier is more effective when used in a highly sophisticated and high-density mountable semiconductor device, compared with wire bonding.

A TAB tape carrier also can serve as a means for supporting a semiconductor chip by a base film thereof. Therefore, a known semiconductor device using a TAB tape carrier, does not have a particular pad for supporting the chip, and the semiconductor chip is directly supported by the TAB tape carrier.

Recent high technology information processes require high-density semiconductor devices usable in a high-frequency range, and accordingly, high-density conductive patterns can be formed on the TAB tape carrier. Nevertheless, these conductive signal patterns must be arranged very close to each other, and as a result, if an ultra high-frequency signal is supplied to the conductive signal patterns on the conventional TAB tape carrier, a part of the high-frequency signal supplied to a conductive pattern would leak to an adjacent conductive pattern, to cause crosstalk or noise due to voltage variations in a power supply line or pattern.

Therefore, an improved semiconductor device using a TAB tape carrier adapted to a ultra high-frequency range is urgently required, to overcome these problems of crosstalk or noise and realize a high-density semiconductor device.

SUMMARY OF THE INVENTION

An object of the present invention is to provide an improved semiconductor device using a TAB tape carrier, which device has a good frequency characteristic and crosstalk or noise is effectively eliminated.

Therefore, according to this invention, there is provided a semiconductor device comprising: a semiconductor chip having a plurality of electrodes or pads; a lead frame having a plurality of leads; a tape carrier comprising an insulative base film and a plurality of conductive patterns formed on the base film, one or more of the conductive patterns being used as a ground line or lines; the electrodes or pads of the semiconductor chip being electrically connected to the respective leads of said lead frame via the respective conductive patterns of the tape carrier; and a molded resin for hermetically and integrally sealing at least the semiconductor chip and the tape carrier, a conductive pad is arranged in proximity the conductive patterns of the tape carrier and is electrically connected to the ground line or lines.

According to the present invention, since the pad is connected to the ground, and therefore, has a ground voltage, crosstalk among the conductive signal lines of the TAB tape carrier and noise due to, for example, a leak from the power supply line to the conductive signal lines, can be eliminated or reduced.

DETAILED DESCRIPTION OF THE PREFERRED EMBODIMENTS

Figure 1A:
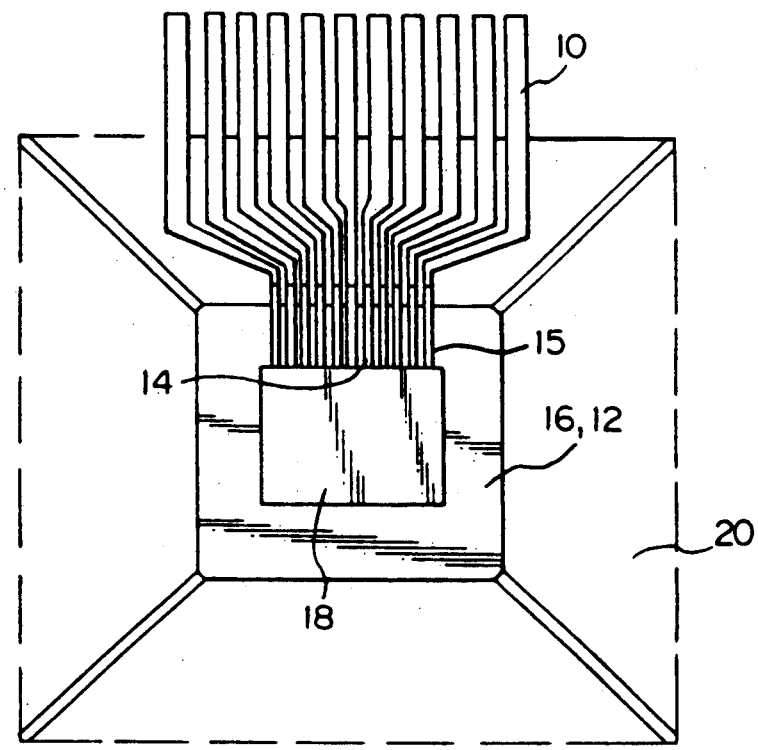
FIG. 1A is a plan view of an embodiment of a semiconductor device according to the present invention.
Figure 1B:
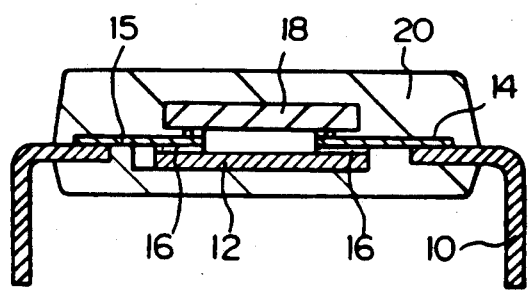
FIG. 1B is a cross-sectional view of the embodiment shown in FIG. 1A.

Referring now to the drawings, wherein FIGS. 1A and 1B show a first embodiment of a semiconductor device according to the present invention, a plurality of outer leads 10 and a conductive pad 12 are integrally formed as a single unit of a lead frame.

The TAB tape carrier comprises electrically conductive circuit patterns 14 formed of a suitable metal such as copper foil, and an electrically insulative flexible base film 16 made of, for example, a polyimide strip film, for supporting the circuit patterns 14, which are formed by electroplating the film with gold or the like.

A semiconductor chip 18 is provided with electrode or pads which are electrically connected, by bonding, to respective inner leads of the circuit patterns 14 of the TAB tape carrier.

In this embodiment, the semiconductor chip 18 is connected directly to the circuit patterns 14 formed on a first, upper surface of the base film 16 of the TAB tape carrier. After the semiconductor chip 18 is connected the TAB tape carrier, the respective outer leads of the circuit patterns 14 are connected, by bonding, to the above-mentioned outer leads 10 of the lead frame. At the same time, a conductive pad 12 is adhered, by a suitable adhesive layer (not known), to the second, lower surface of the base film 16. Namely, the TAB tape carrier associated with the semiconductor chip 18 is electrically connected to the lead frame via the respective circuit patterns 14.

Thereafter, the semiconductor chip 18, the circuit patterns 14, and the pad 12 are hermetically sealed or covered with a resin 20, to obtain a solid type semiconductor device.

It should be noted that the pad 12 is electrically connected to a ground line 15, which is one of the conductive patterns of the TAB tape carrier, as shown in FIGS. 3A, 3B, 4A and 4B so that the voltage of the pad 12 is at the ground level.

Figure 3A:
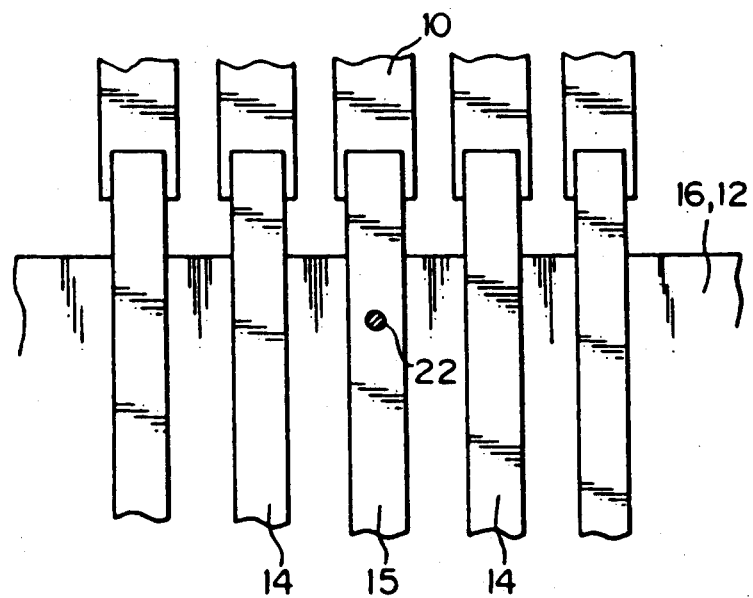
FIG. 3A is a plan view illustrating an embodiment in which the pad is connected to the ground line.
Figure 3B:
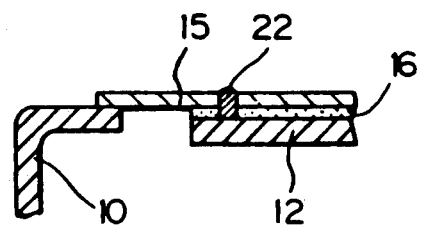
FIG. 3B is a cross-sectional view of the embodiment shown in FIG. 3A.
Figure 4A:
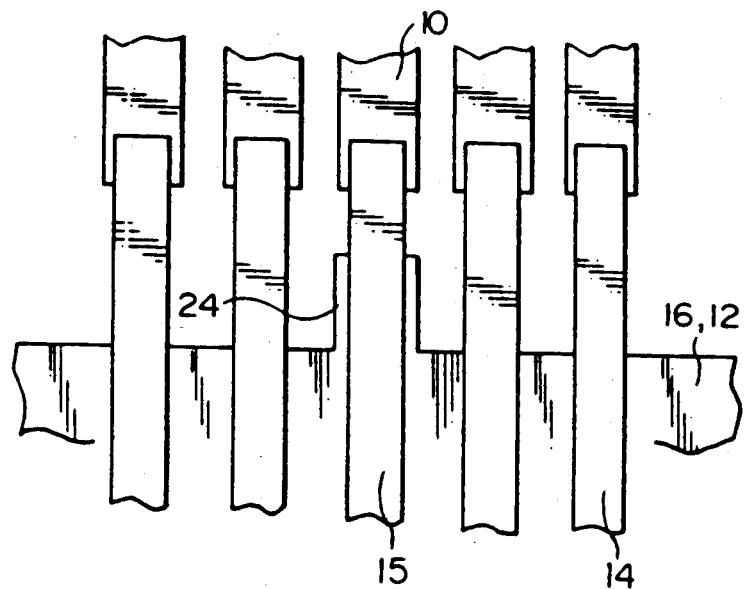
FIG. 4A is a plan view illustrating another embodiment in which the pad is connected to the ground line.
Figure 4B:
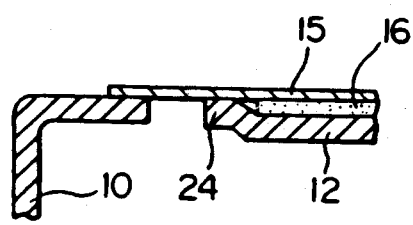
FIG. 4B is a cross-sectional view of the embodiment shown in FIG. 4A.

In FIGS. 3A and 3B, the base film 16 is provided with a through hole at a position corresponding to the ground line 15 of the conductive patterns of the TAB tape carrier, and an electrically conductive adhesive paste 22 is filled in the through hole to establish an electrical connection between the pad 12 and the ground line 15. In FIGS. 4A and 4B, the pad 12 has a projection 24 formed at a peripheral edge thereof and electrically connected to the ground line 15 by, for example, spot welding or the like, at the same time as when the conductive patterns 14 are connected to the respective outer leads 10.

Figure 2A:
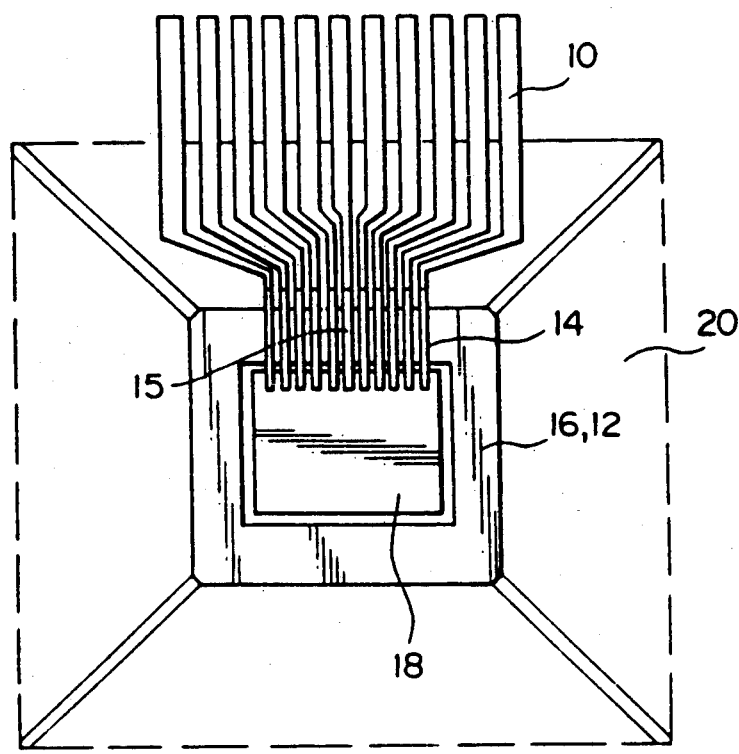
FIG. 2A is a plan view of another embodiment of a semiconductor device according to the present invention.
Figure 2B:
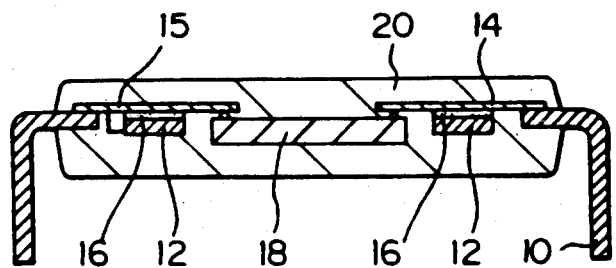
FIG. 2B is a cross-sectional view of the embodiment shown in FIG. 2A.

FIG. 2A and 2B show a second embodiment of a semiconductor device according to the present invention. In this second embodiment, the semiconductor chip 18 is connected to a second, lower surface of the TAB tape carrier, on which the base film 16 is provided, contrary to the previous embodiment. Also, in this embodiment, the base film 16 is formed as a rectangular frame having a predetermined width and a central opening, to connect the semiconductor chip 18 to the inner part of the base film 16. The pad 12 has a rectangular frame-shape corresponding to the shape of the base film 16. Namely, the conductive patterns 14 of the TAB tape carrier are electrically connected to the respective electrodes or pads of the semiconductor chip 18, and the pad 12 is then adhered to the base film 16 when the conductive patterns 14 are connected to the outer leads 10.

As in the previous embodiment, the pad 12 and a ground line 15 among the conductive patterns 14 are electrically connected so that the voltage at the pad 12 is ground level.

According to the present invention, the pad 12 is arranged close to the respective signal lines pattern on the TAB tape carrier and is electrically connected to the ground line 15, and thus the voltage at the pad 12 is always at the ground level. Therefore, the pad 12 functions as a microstrip line with respect to the signal lines among the conductive patterns 14, whereby noise due to the power supply line can be easily diverted to the ground line, and thus the noise can be removed from the signal lines, and crosstalk, otherwise generated between the signal lines, is effectively prevented.

Therefore, according to the present invention, since the ground level pad 12 is arranged in the vicinity of the respective signal lines pattern, a high-density semiconductor device can be obtained.

In the above embodiment the lead frame is provided with a pad 12, and this pad 12 can be easily formed during the manufacturing process for making a known lead frame.

Although preferred embodiments and modifications of this invention have been described above with reference to the drawings, it should be understood that the scope of this invention is not limited to such embodiments or modifications, and that other modifications can be made by a person skilled in the art within the scope or spirit of this invention as claimed in the attached claims.

What is claimed is:

1. A semiconductor device using a TAB tape carrier, comprising:

a semiconductor chip having a plurality of bonding pads;

a lead frame including a plurality of leads;

a tape carrier comprising an electrically insulative flexible base film and a plurality of conductive patterns on said electrically insulative flexible base film, at least one of said conductive patterns functioning as a ground line;

said bonding pads of said semiconductor chip being electrically connected to said respective leads of said lead frame via said respective conductive patterns of said tape carrier;

a molded resin for hermetically and integrally sealing at least said semiconductor chip and said tape carrier; and a conductive pad disposed in proximity to said conductive patterns of said tape carrier, said conductive pad being electrically connected to said at least one ground line so that a voltage of the conductive pad is at ground level; and said electrically insulative flexible base film having a first surface on which said conductive patterns are formed and an opposite, second surface, and said conductive pad is in contact with said opposite, second surface of said base film.

2. A semiconductor device as set forth in claim 1, wherein said base film is provided with a through hole at a position corresponding to said at least one ground line, and a conductive adhesive paste is filled in said through hole to electrically connect said pad to said at least one ground line via said adhesive paste filled in said through hole.

3. A semiconductor device as set forth in claim 1, wherein said conductive patterns, including said at least one ground line, are extended over said insulative base film, and said pad includes at a peripheral edge thereof a projection projected over said insulative base film, said projection being connected to said extended portion of said at least one ground line.

4. A semiconductor device as set forth in claim 1, wherein said semiconductor chip is arranged on an opposite side of said pad with respect to said tape carrier.

5. A semiconductor device as set forth in claim 1, wherein said pad has a shape of a rectangular frame, and said semiconductor chip is arranged on a same side of said pad with respect to said tape carrier in such a manner that said semiconductor chip is located within an area defined by a central opening of said rectangular frame-shaped pad.

* * * * *